United States Patent [19]

Tardoskegyi

[11] 3,868,272

[45] Feb. 25, 1975

[54] CLEANING OF PRINTED CIRCUIT BOARDS BY SOLID AND COHERENT JETS OF CLEANING LIQUID

[75] Inventor: Louis V. Tardoskegyi, Montreal, Quebec, Canada

[73] Assignee: Electrovert Manufacturing Co. Ltd., Montreal, Quebec, Canada

[22] Filed: Mar. 5, 1973

[21] Appl. No.: 337,922

[52] U.S. Cl. .......................... 134/26, 134/32, 134/72, 134/131

[51] Int. Cl. .......................... B08b 3/02

[58] Field of Search .......... 134/32, 34, 26, 15, 64, 134/72, 130, 131, 157

[56] References Cited

UNITED STATES PATENTS

| | | | |
|---|---|---|---|
| 1,932,827 | 10/1933 | Morris et al. | 134/72 |
| 2,250,238 | 7/1941 | Smith | 134/72 |
| 2,597,930 | 5/1952 | Grosvenor | 134/157 UX |
| 2,926,674 | 3/1960 | Umbricht et al. | 134/72 |
| 3,144,872 | 8/1964 | Kearney | 134/72 |
| 3,421,211 | 1/1969 | Eaves et al. | 134/72 X |
| 3,442,708 | 5/1969 | Huddle | 134/32 |
| 3,603,329 | 9/1971 | White et al. | 134/131 X |

*Primary Examiner*—S. Leon Bashore
*Assistant Examiner*—Richard V. Fisher
*Attorney, Agent, or Firm*—McGlew and Tuttle

[57] ABSTRACT

Printed circuit boards, in which the printed circuitry has been fluxed and tinned or soldered and in which the leads of components have been connected to the printed circuitry by fluxing and soldering, are cleaned by placing each printed circuit board on an endless traveling screen forming a perforated belt which passes through one or more cleaning tanks which are closed except for entry and exit openings for the endless traveling screen and the printed circuit board supported thereon. Each tank has mounted therein vertically spaced, horizontally and longitudinally extending upper and lower bulkheads between which the endless screen travels, the upper bulkhead being somewhat longer than the lower bulkhead and the lower bulkhead being substantially centered longitudinally relative to the upper bulkhead. Each bulkhead is provided with a plurality of closely laterally spaced nozzles for directing high velocity solid jets of cleaning liquid, having a substantially continuously uniform small cross-section, perpendicularly against the entire upper and bottom or lower surfaces of the printed circuit board as well as against components and leads thereon, to penetrate the liquid residue on the surfaces of the printed circuit boards and sweep the liquid off the printed circuit boards to clean the surfaces thereof.

12 Claims, 5 Drawing Figures

CLEANING OF PRINTED CIRCUIT BOARDS BY SOLID AND COHERENT JETS OF CLEANING LIQUID

FIELD AND BACKGROUND OF THE INVENTION

This invention relates to the cleaning of printed circuit boards having components mounted thereon and soldered to the printed circuitry and, more particularly, to a novel and improved method and apparatus for cleaning such printed circuit boards by high velocity jets of cleaning fluid directed against the upper and lower surfaces of the boards and not requiring the boards to be clamped onto a supporting surface.

A typical printed circuit board or PCB is a plastic plate, board or card having copper circuitry imprinted on one or both surfaces thereof and formed with apertures therethrough for mounting electronic components and to receive component leads for connection to the printed circuitry board. Such a typical printed circuit board has an appearance, in cross-section, as illustrated in FIG. 1 of the accompanying drawing.

After positioning of the components on the printed circuit board with their leads inserted through the apertures therein, the leads are cut and crimped over beneath the board. The leads are then soldered to the printed copper circuitry in a series of steps. In the first step, the bottom surface of the printed circuit board is fluxed by, for example, passing the printed circuit board through a standing wave of liquid flux. Following fluxing of the bottom surface of the printed circuit board, the bottom surface is preheated to evaporate the solvent of the flux and to avoid heat shock during soldering. The preheated circuit board is then brought into contact with molten solder, as by being passed through a standing wave of molten solder. The hot molten solder further heats the printed circuitry and the leads, with the flux being driven up into the holes in the board, followed by the solder, and finally the leads are soldered to the printed circuitry. When the soldering operation is finished, both the bottom and top surfaces of the printed circuit board are covered with flux residue, which later can produce corrosion or current creepage problems. Therefore, it is necessary that this flux residue be thoroughly and completely cleaned off both surfaces of the printed circuit board.

The production of printed circuit board assemblies, including the steps of printing, drilling, lead-inserting, fluxing and soldering, is completely automated in mass production plants but, until the present, cleaners which are adaptable to, or which fit into, such automated in-line operation can attain only a very limited quality of cleanliness. While such a limited quality of cleanliness might be acceptable for some low or medium quality printed circuit boards, all high quality printed circuit boards require an additional manual cleaning involving high labor cost and production time. Several types of cleaners are either available on the market or are manufactured, for their own use, by electronics manufacturers. Among the several types of cleaners, are those known as wave cleaners. In wave cleaners, it is necessary to carry the boards in frames or in so-called finger conveyors. The boards are submerged in low velocity water or solvent waves. Due to the low sweeping velocities and limited immersion times, the resulting cleanliness is only of medium quality, the points of the boards at which they are held are not cleaned properly, and the solvent losses are high.

Another type of cleaner involves the combination of brushes and waves and, in this type of cleaner, in addition to the low velocity water or solvent waves, rotating brushes are included to improve the cleaning of the bottom of the printed circuit boards. Such types of cleaners slightly improve the cleaning of the bottom of the printed circuit board, but the top of the printed circuit board, and the points at which the board is held, are not cleaned properly.

A further type of cleaner is a spray cleaner, in which the boards are carried through the cleaner on horizontal or slightly inclined screen belts, and are sprayed from the top and the bottom with water or solvent. There is a basic problem which makes this third type of cleaner ineffective. For good cleaning, a high impact spray at high velocity is necessary, and which should hit directly all the surfaces to be cleaned, even beneath the components. Among the reasons why this is not accomplished by known spray cleaners are the following:

1. The boards are lying on the screen and are not held, and thus are thrown around by any type of high impact spray. As a result, only very limited spraying force can be applied, with the resultant limited end results.

2. When the spray systems include atomizing nozzles, most of the spraying energy is utilized atomizing, and the minute droplets are absorbed by the overlying liquid on the boards and their impact is insufficient to reach the surfaces to be cleaned. Such spray systems in particular have no effect around and underneath the components.

3. If perforated pipe sprayers are applied with the sprays at angles of 30° to 45° to the horizontal, these can be operated at only a very low pressure as otherwise they will throw the board around on the screen conveyor. Additionally, they have other disadvantages such as overlapping each other, etc.

In addition to the aforementioned cleaning devices, ultrasonic pot cleaners, with vapor cleaning, are available in various configurations and, if operated properly, they are very effective. However, these cleaners are very slow in operation, they cannot be operated in-line, the labor cost is high, and the results depend on the reliability of the operator.

SUMMARY OF THE INVENTION

The objective of the invention is to provide a cleaning method and apparatus avoiding the disadvantages of the prior art cleaners, as mentioned above, and which can be used in production line operation to attain a very high quality of cleaning of printed circuit boards at a very low cost. Generally speaking, in the present invention, the printed circuit boards, during the cleaning operation, are supported on an endless traveling screen or perforated metal belt so that the printed circuit boards may be subjected to the action of cleaning fluids directed against both opposite surfaces of the printed circuit boards.

The requirements for effective high quality cleaning of printed circuit boards may be summarized as follows:

1. Avoiding mechanical holding of the printed circuit boards on the traveling screen in order to expose the entire areas of the upper and lower surfaces of the boards to the cleaning operation.

2. Holding the board firmly on the surface of the supporting screen while impacting high velocity jets of cleaning fluid against the printed circuit boards without throwing the boards around.

3. Utilizing a spray or jet of cleaning fluid which is able to penetrate the overlying liquid cover on the printed circuit boards. In this connection it should be noted that, despite the fact that the amount of the flux residue on the bottom of a printed circuit board is several times the amount on the upper surface thereof, the bottom surface is cleaned relatively easily because there is no overlying liquid thereon and the spray can reach the surface, in addition to which there are no components on the bottom surface to interfere with the spray.

4. Providing a jet of cleaning fluid able to penetrate the spaces beneath the components on the upper surface of the printed circuit boards.

5. Avoiding splashing and mist during the cleaning, as splashing and mist lead to extreme solvent losses.

The present invention fully satisfies all these requirements by utilizing seemingly simple means in a completely novel manner. Thus, in accordance with the present invention, a plurality of closely laterally spaced, high velocity solid jets of cleaning fluid are impacted perpendicularly against the entire upper surface of a printed circuit board, as well as the components thereon, to penetrate the overlying liquid residue on the upper surface and to sweep the liquid off the upper surface to clean the latter, with these high velocity solid jets of cleaning fluid pressing the printed circuit board against the screen conveyor. In addition, while the printed circuit board is pressed against the screen conveyor by the first-mentioned solid jets of cleaning fluid, a second series of closely laterally spaced, high velocity solid jets of cleaning fluid are impacted perpendicularly against the entire bottom surface of the printed circuit board to penetrate the liquid residue thereon and to sweep the liquid residue off the bottom surface of the printed circuit board to clean the latter. During impacting of the upwardly directed jets of cleaning fluid against the bottom surface of the printed circuit board, the printed circuit board is maintained firmly on the screen by the pressure of the downwardly directed first-mentioned high velocity solid jets of cleaning fluid.

The cleaning is effected in a tank which is closed except for entry and exit openings for the endless screen conveyor and the printed circuit boards resting thereon. As a printed circuit board enters the tank, it is initially impacted by the downwardly directed high velocity solid jets of cleaning fluid before it is impacted by the upwardly directed high velocity solid jets of cleaning fluid, and the exposure of the bottom surface of the printed circuit board to the upwardly directed jets is terminated before the printed circuit board passes out of the range of the downwardly directed high velocity jets impacting its upper surface, thereby assuring stable maintenance of the printed circuit board on the endless screen conveyor.

An object of the invention is to provide an improved method of and apparatus for cleaning printed circuit boards which have been fluxed and soldered.

Another object of the invention is to provide such a method and apparatus which may be used in an in-line automated mass production operation for producing printed circuit boards.

A further object of the invention is to provide such a method and apparatus in which, when the printed circuit boards are being cleaned, they are maintained on a perforated support without the use of holding means and solely by either gravity or by hydraulic pressure against their upper surfaces.

For an understanding of the principles of the invention, reference is made to the following description of a typical embodiment thereof as illustrated in the accompanying drawing.

DESCRIPTION OF THE PREFERRED EMBODIMENT

Figure 1:
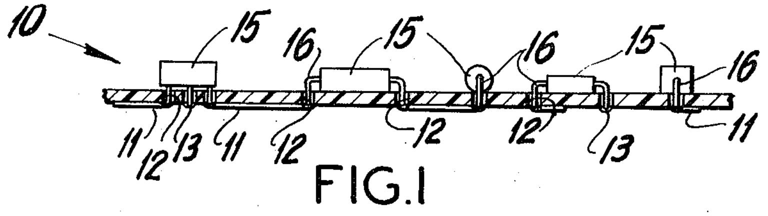
FIG. 1 is a sectional view through a typical printed circuit board having electronic components connected to the printed circuitry thereof.

Referring first to FIG. 1 of the drawing, a printed circuit board, generally indicated at 10, has printed circuitry 11 on its undersurface and may have printed circuitry on its upper surface, the printed circuit board 10 being further formed with apertures 12 extending therethrough. Electronic components, generally indicated at 15, are connected to the printed circuitry 10 by having their leads 16 inserted through the apertures 12 and then soldered to printed circuitry 11 as generally indicated at 13. Typical electronic components which may be mounted on such a printed circuit board include condensers, resistors, inductances, transistors, and the like. As previously mentioned, after insertion of the component leads 16 through the apertures 12, the undersurface of printed circuit board 10 is fluxed, is then preheated to evaporate the solvent of the flux and to avoid heat shock, and the preheated board is then brought into contact with molten solder, as for example being passed through a standing wave of molten solder. The fluxing may also be effected by passing the printed circuit board in contact with a standing wave of liquid flux. The hot solder further heats up the printed circuitry and the leads, whereby the flux is driven up into the apertures or holes 12 followed by the solder, and finally, the leads are soldered to the printed circuitry. When the soldering operation is finished, both the upper and lower surfaces of board 10 are covered with flux residue which later can produce corrosion or current creepage problems, so that thorough cleaning of the upper and lower surfaces of board 10 is necessary.

Figure 2:
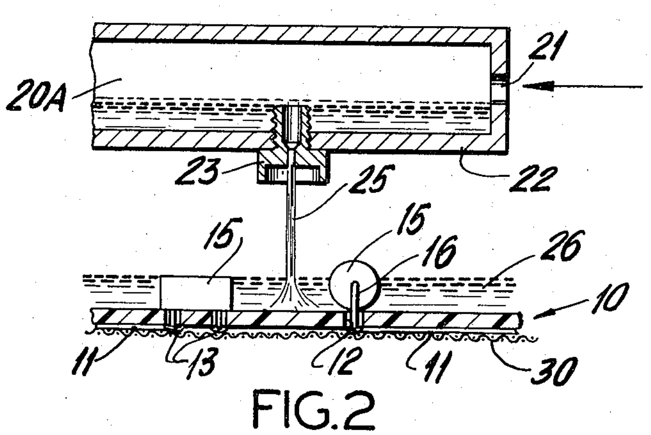
FIG. 2 is a partial sectional view of a bulkhead illustrating one nozzle directing a high velocity coherent or solid jet of cleaning fluid against the upper surface of a printed circuit board such as shown in FIG. 1.

The cleaning action of the apparatus of the invention is best illustrated in FIG. 2, which shows the cleaning action on the upper surface of printed circuit board 10. An upper bulkhead or header 20A has an inlet 21 to which there is supplied cleaning fluid at high pressure from a suitable pump, as described hereinafter. The upper header 20A is substantially rectangular in plan and has a width in excess of the width of the printed circuit boards to be cleaned and a length which is a multiple of the length of the circuit board. Bulkhead or header 20A has a lower wall 22 formed with a large number of threaded apertures arranged in a predetermined pattern, as explained hereinafter, and each aperture has threaded thereinto a nozzle 23 designed to discharge a high velocity solid or coherent jet of cleaning fluid perpendicularly against the upper surface of printed circuit board 10, this jet being indicated at 25. The jets 25, due to their high impact velocity energy, break through the overlying liquid layer 26 on the upper surface of printed circuit board 10, and the jets spread out horizontally, adhering to the upper surface of printed circuit board 10.

It will be noted, from FIGS. 1 and 2, that at least some of the electronic components 15 are spaced a slight distance above the upper surface of printed circuit board 10, being supported by their leads 16. If the horizontally spreading cleaning fluid from the jets 10 encounters a component 15 obstructing the horizontal flow, the high impact velocity energy is transformed to pressure energy and produces a sweeping flow of cleaning fluid under components 15 for a proper cleaning effect. As will be explained more fully hereinafter, nozzles 23 are laid out in such a way what any component 15 receives many direct hits, by solid, coherent jets of cleaning fluid, on its upper end, and many more right alongside the component to produce a cleaning effect beneath the component as well as on the remainder of the upper surface of printed circuit board 10. FIG. 2, as stated, illustrates the cleaning action on the upper surface of printed circuit board 10, but it should be understood that essentially the same cleaning action occurs on the lower surface of printed circuit board 10.

Figure 3:
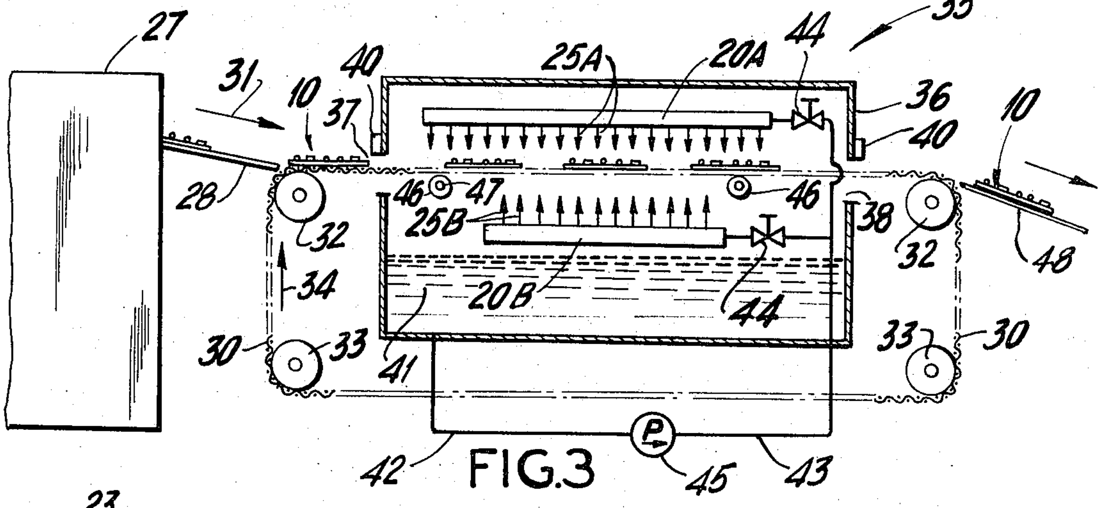
FIG. 3 is a somewhat schematic elevation view of apparatus embodying the invention as mounted in an automated production line for printed circuit boards.

FIG. 3 illustrates a single cleaning stage, embodying the invention, as used in-line in an automated printed circuit board production line. The printed circuit boards are fluxed and soldered, in the manner mentioned above, in a suitable fluxing and soldering unit 27 which may be of the type shown and described in U.S. Pat. No. 3,386,166, issued Sept. 4, 1968, and the printed circuit boards 10 are delivered by an inclined chute 28 to an endless screen conveyor 30. The direction of delivery of the printed circuit boards is indicated by the arrow 31. Endless screen conveyor 30 is trained about upper support rollers 32 and lower support rollers 33, and travels in the direction of the arrow 34, the relative disposition and orientation of the rollers being such that the upper run of conveyor 30 is substantially horizontal. This upper run extends horizontally through a cleaning unit generally indicated at 35 and comprising a substantially rectangular tank 36 which is substantially completely closed except for a conveyor and printed circuit board inlet opening 37 in one end wall and a corresponding outlet opening 38 in the opposite end wall. Air knives 40 are provided adjacent inlet 37 and outlet 38, to provide air curtains at the inlet and outlet openings to reduce splashing and mist.

Upper and lower bulkheads 20A and 20B, respectively, are supported within tank 36 to extend parallel to the upper run of conveyor 30, the bulkheads or headers being located parallel to each other and at substantially equal distances from the upper and lower surfaces of the screen conveyor 30. The bulkheads 20A and 20B have the same construction as illustrated in FIG. 2, but it will be noted that upper bulkhead 20A is substantially longer than lower bulkhead or header 20B, with lower bulkhead or header 20B being centered longitudinally of upper bulkhead or header 20A. The purpose of this particular arrangement will be described more fully hereinafter.

In advance of the cleaning operation, tank 36 is filled to the proper level with a cleaning liquid 41. Depending upon the particular stage of the cleaning process, and the particular fluxes used in processing the printed circuit boards, the cleaning liquid may be a biodegradable solvent, a neutralizing agent, or water. In the represented cleaning stage shown in FIG. 3, the cleaning liquid 41 is supplied from the bottom of tank 42 to a high pressure pump 45 which supplies the cleaning liquid through a supply line 43 and valves 44 to the bulkheads or headers 20A and 20B, from which it is discharged in the form of the respective closely laterally spaced, high velocity solid or coherent jets 25A and 25B directed perpendicularly against the surfaces of the printed circuit board. When a jet 25A or 25B strikes a surface of the printed circuit board, it is transformed into a fast expanding film along the surface in every direction, and which adheres to the surface. This film thus generates a scrubbing action which wipes away the spent cleaning fluid and supplies fresh cleaning fluid continuously. The fluid, which clings to the surfaces of the board, penetrates into the spaces between the boards and the components and cleans the hidden surfaces and the crevices.

As the printed circuit boards enter the tank 36 on the endless screen conveyor 30, they are initially subjected to the high velocity coherent solid jets 25A directed against the upper surface of the printed circuit board, and these jets maintain the printed circuit board firmly engaged with the endless screen conveyor 30. Somewhat later, the undersurfaces of the printed circuit boards have impacted thereagainst the high velocity solid and coherent jets 25B from the lower bulkhead or header 20B. These lower jets do not have any disturbing action on the printed circuit board as the printed circuit board is maintained in firm engagement with the endless screen conveyor 30 by the high velocity jets 25A which are directed downwardly against the printed circuit board. It will be noted that the board passes out of the range of the jets 25B before it passes out of the range of the jets 25A, so that as the board moves toward the outlet 38, it is maintained firmly against the endless screen conveyor 30.

The relatively fine reticulated members of the endless screen conveyor 30 prevent the lower jets 25B from actually striking against the entire lower surface of the printed circuit board 10. To avoid the possibility that those areas of the printed circuit board in actual contact with the reticulated elements of the endless screen conveyor 30 are not exposed to the upwardly directed solid coherent jets 25B, the upper run of conveyor 30, passing through the tank 36, is guided over rollers 46 which are eccentrically mounted on shafts 47. Due to these eccentric rollers 46, the printed circuit boards 10 are slightly shifted on the endless screen conveyor 30 so as to expose those areas initially covered by the reticulated components or elements of the endless screen conveyor.

FIG. 3 illustrates an arrangement in which the cleaning liquid is recirculated by means of the pump 45 and the lines 42 and 43. This is exemplary only, as the cleaning liquid could be supplied directly to the bulkheads or headers 20A and 20B from pump 45 through supply line 43 with the inlet of pump 45 being connected to a container of cleaning fluid. In some instances, this latter arrangement may be desirable. Tank 36 is provided with a drain plug or the like by means of which the fluid may be drained from the tank, or else the fluid may be drained through line 42 and through a valve connected in the line and which has not been shown. Also, the top of the tank may be made removable so that the tank can be thoroughly cleaned and scrubbed inside after having had the cleaning fluid emptied therefrom. Loss of cleaning fluid can be made up by adding additional cleaning fluid into the tank through a suitable normally closed opening or through either the inlet opening 37 or the outlet opening 38. The thorougly cleaned printed circuit boards leaving the cleaner 35 on endless screen conveyor 30 are discharged along an inclined discharge chute 48, in the case of a single stage operation.

Figure 4:
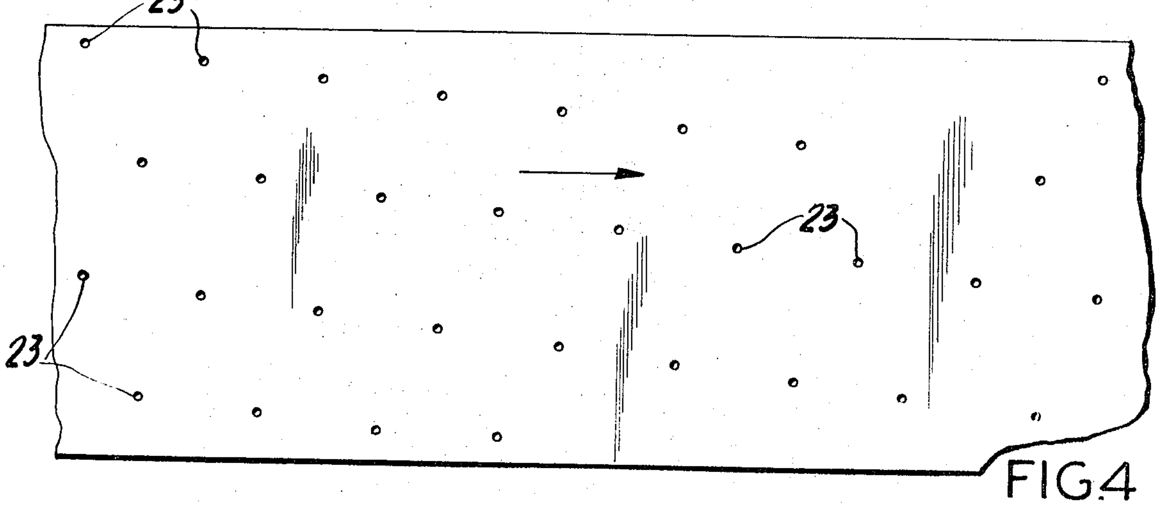
FIG. 4 is a plan view illustrating the distribution of the nozzles providing the high velocity solid or coherent jets.

FIG. 4 illustrates the arrangement of the multiplicity of nozzles 23 providing the jets 25. The nozzles 23 are arranged in successive rows along the width of the endless belt conveyor 30, both in the traveling direction and across the width of the conveyor, on 1 inches centers. To allow the development of the effective scrubbing flow, the nozzles are offset, from row to row, by one-eighth inch, for complete coverage of the printed circuit board by the jets 25A and 25B. The number of nozzles used in the cleaning apparatus 35 depends on the quantity of residues on the incoming printed circuit boards and on the speed of endless screen conveyor 30 which may be driven in any suitable manner, as by a motor connected in driving relation to one or more of the rollers 32 or 33. Furthermore, tank 35 is provided with portholes for supervision and maintenance, drain valves, overflows and controllable connections. While the pump 45 in the recirculating arrangement illustrated somewhat schematically in FIG. 3 is located outside tank 36, in actual practice, a recirculating cleaning stage would be provided with submerged vertical pumps without stuffing boxes, to avoid dripping, and with large easily removable filters. The velocity of the jets 25A and 25B is adjustable to be as high as 65 ft. per second, or 3,900 ft. per minute.

Figure 5:
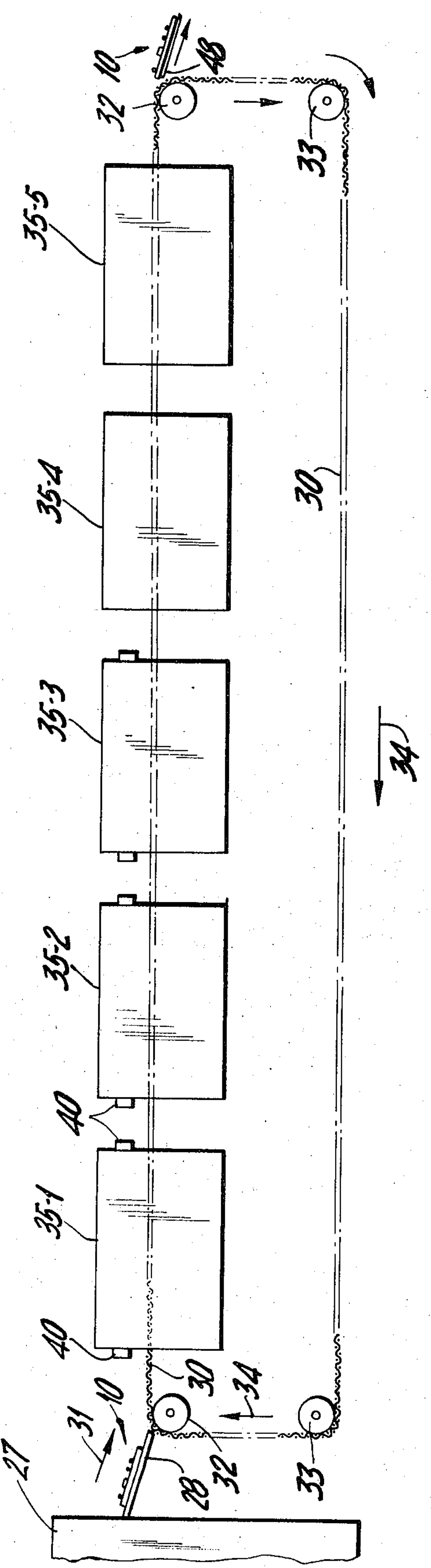
FIG. 5 is a view, similar to FIG. 3, but illustrating a multistage cleaning operation.

A typical multistage cleaning apparatus is illustrated in FIG. 5, as comprising five stages 35-1 through 35-5. In such a case, the conveyor belt 30 extends through all of the stages before making its return run. The initial stage 35-1 receives the fluxed and soldered printed circuit boards 10, having the components 15 thereon, from the fluxing and soldering apparatus or line 27 by means of the chute 28 along which the printed circuit boards slide onto the endless screen conveyor 30. The stage 35-1 is essentially that described in connection with FIG. 3, and tank 36 is filled with the required cleaning agent properly diluted in accordance with the manufacturer's instructions and heated to 40° or 50° below the normally recommended level. The effectiveness of the special nozzle system does not require high temperature.

The printed circuit boards leaving initial stage 35-1 on endless screen conveyor 30 enter the second stage 35-2 in which the boards washed with a solvent or the like in stage 35-1 are washed thoroughly to remove the solvent residues from the board surfaces and crevices. Stage 35-2 is essentially the same as stage 35-1, except that it is filled with washing water with the water losses being substituted and the recirculating water being replenished with the rinsing water coming from stage 35-3. Alternatively, the second stage 35-2 could have fresh water continuously supplied thereto throught the pump 45. The water washing action is effected by three rows of upper nozzles 23 and two rows of lower nozzles 23.

The third stage 35-3 is a rinsing stage having two rows of the nozzles 23, one row above the endless screen conveyor 30 and the other row below the endless screen conveyor. These nozzles are supplied with fresh water, tap water, soft water, or di-water. The purpose of the rinsing stage 35-3 is to exchange the slightly contaminated recirculating water, which adheres to the boards, with clean water. The rinsing water supply is interlocked with the conveyor and starts and stops with the conveyor. If the rinsing water used is di-water, the water distribution valve nozzles and pipes are constructed of resistant materials.

To remove as much rinsing water from the boards as possible, and to facilitate the drying, the boards are then passed through the fourth stage 35-4 in which there are five rows of nozzles connected to sources of air under pressure, three rows above the boards and two rows beneath the boards. The air supply again is interlocked with the conveyor so as to be turned on when the conveyor is moving and to be interrupted when the conveyor halts.

From the fourth stage 35-4, the boards are delivered to a last stage 35-5 where both sides of the printed circuit boards are exposed to a stream of electrically heated air, with the air temperature being controllable up to 160°F. This stage 35-5 is designed to dry moisture from the boards. From the last stage 35-5, the printed circuit boards 10 are delivered by the endless screen conveyor 30 to inclined discharge chute 48, from which the thoroughly cleaned printed circuit boards may be removed manually or by additional conveyor means.

While a specific embodiment of the invention has been shown and described in detail to illustrate the application of the principles of the invention, it will be understood that the invention may be embodied otherwise without departing from such principles.

What is claimed is:

1. A method of cleaning printed circuit boards having components mounted on their upper surfaces, and which have been fluxed and soldered and have had leads of the components connected to the printed circuitry thereof by fluxing and soldering, said method comprising the steps of supporting each printed circuit board directly on a perforated support on which the printed circuit board is held initially solely by gravity; while the printed circuit board is thus supported, directing a multiplicity of closely laterally spaced, high velocity first solid and coherent jets of cleaning liquid, having a substantially continuously uniform small cross-section, perpendicularly against the entire upper surface of the printed circuit board and against the components thereon, to impact the board at high velocity to penetrate the overlying liquid residue, resulting from the fluxing and soldering, on the upper surface of the printed circuit board and to be deflected laterally over the board surface to sweep the liquid off the printed circuit board to clean the upper surface of the printed circuit board, and to impinge laterally against the components and the component leads to clean the same; and while the printed circuit board is pressed against the perforated support by the first solid and coherent high velocity liquid jets, directing a multiplicity of closely laterally spaced, high velocity second solid and coherent jets of cleaning liquid, having a substantially continuously uniform small cross-section, perpendicularly against the entire bottom surface of the printed circuit board, to impact the board at high velocity to penetrate the liquid residue, resulting from the fluxing and soldering, on the bottom surface of the printed circuit board and to be deflected laterally over the board surface to sweep the liquid off the printed circuit board to clean the bottom surface thereof; the perforated support being moved along a path of travel intersecting the first and second solid coherent jets to bring the printed circuit boards into operative association with the jets and to move the printed circuit boards out of operative association with the jets; the solid coherent jets being arranged in closely uniformly laterally spaced relation in successive rows extending laterally of the path of travel, with each successive row being progressively laterally offset through a small distance relative to the immediately preceding row whereby substantially every discrete area on the board surfaces is impacted by at least one jet.

2. A method of cleaning printed circuit boards, as claimed in claim 1, in which, to assure cleaning of the entire bottom surface of each printed circuit board, the printed circuit board is vibrated vertically to be slightly shifted on its support while being impacted by said multiplicity of first and second jets of cleaning liquid.

3. A method of cleaning printed circuit boards, as claimed in claim 1, in which said printed circuit boards are cleaned in successive stages in each of which the printed circuit boards are supported on perforated supports and subjected to the impact of said multiplicity of first and second high velocity solid and coherent jets of cleaning fluids; in an initial stage, utilizing a cleaning liquid comprising solvents for residues resulting from the fluxing and soldering operations; and, in at least one succeeding stage, utilizing water as the cleaning liquid to wash away any solvent residues.

4. A method of cleaning printed circuit boards, as claimed in claim 3, in which, in a further stage following the washing with water, the printed circuit boards are subjected to an air drying operation to remove moisture therefrom.

5. Apparatus for cleaning printed circuit boards having components mounted on their upper surfaces, and which have been fluxed and soldered and have had leads of the components connected to the printed circuitry thereof by fluxing and soldering, said apparatus comprising, in combination, a perforated support receiving each printed circuit board and on which the printed circuit board is held initially solely by gravity; means operable, while a printed circuit board is supported on said support, to direct a multiplicity of closely laterally spaced, high velocity first solid and coherent jets of cleaning liquid, having a substantially continuously uniform small corss-section, perpendicularly against the entire upper surface of the printed circuit board and against the components thereon, to impact the board at high velocity to penetrate the overlying liquid residue, resulting from the fluxing and soldering, on the upper surface of the printed circuit board and to be deflected laterally over the board surface to sweep the liquid off the printed circuit board to clean the upper surface thereof, and to impinge laterally against the components and the component leads to clean the same; and means operable, while the printed circuit board is pressed against the support by said first solid and coherent high velocity liquid jets, to direct a multiplicity of closely laterally spaced, high velocity second solid and coherent jets of cleaning liquid, having a substantially continuously uniform small corss-section, perpendicularly against the entire bottom surface of the printed circuit boards to impact the board at high velocity to penetrate the liquid residue, resulting from the fluxing and soldering, on the bottom surface of the printed circuit board and to be deflected laterally over the board surface to sweep the liquid off the printed circuit board to clean the bottom surface thereof, while the printed circuit board is maintained on said perforated support by the pressure of said first solid and coherent jets; said jets directing means including vertically spaced and substantially parallel upper and lower manifolds; said perforated support comprising an endless screen trained around support rollers to have a substantially horizontal upper run positioned substantially midway between said upper and lower manifolds; said manifolds having substantially planar and substantially rectangular walls facing the upper run of said endless screen and extending substantially parallel thereto; each of said walls being formed with a multiplicity of closely laterally spaced openings each receiving a respective discharge nozzle having its discharge axis extending substantially perpendicular to the plane of the upper run of said perforated screen; and high pressure pump means having an inlet connected to a source of cleaning liquid and an outlet connected to both of said manifolds and supplying cleaning liquid at high pressure to both of said manifolds for discharge through said nozzles in the form of high velocity solid and coherent jets of cleaning liquid impacting against the surface of printed circuit boards supported on the upper run of said endless screen for movement along a path of travel extending between said manifolds; said openings being uniformly spaced in successive rows extending laterally of said endless screen, and successive rows being progressively offset laterally through a small distance relative to the immediately preceding row; whereby substantially every discrete area of the board surfaces is impacted by a jet of cleaning liquid.

6. Apparatus for cleaning printed circuit boards, as claimed in claim 5, in which, considered in the direction of travel of the upper run of said endless screen, said upper manifold is substantially longer than said lower manifold, with said lower manifold being substantially centered longitudinally of said upper manifold; whereby a printed circuit board on said endless screen is initially impacted by the high velocity jets directed thereagainst from the nozzles of said upper manifold before being impacted by the high velocity jets directed thereagainst from the nozzles of said lower manifold, with the printed circuit board being held against said endless screen by the high velocity jets from said upper manifold after having passed out of the range of the high velocity jets from said lower manifold.

7. Apparatus for cleaning printed circuit boards, as claimed in claim 5, including a substantially closed tank in which said manifolds are mounted, said tank having a pair of end walls formed, respectively, with an inlet opening and an outlet opening for the upper run of said endless screen carrying printed circuit boards; said tank being adapted to contain a quantity of cleaning liquid for communication with the inlet of said pump; means receiving fluxed and soldered printed circuit boards from a fluxing and soldering apparatus and depositing the printed circuit boards on the upper run of said endless screen in advance of said inlet opening; and means receiving the printed circuit boards leaving said outlet opening on said endless screen.

8. Apparatus for cleaning printed circuit boards, as claimed in claim 7, including eccentric roller means in said tank and engaging the undersurface of the upper run of said endless screen to impart a slight vibratory motion thereto to displace printed circuit boards a slight amount parallel to the upper surface of the upper run of said endless screen; whereby said second solid and coherent jets of cleaning liquid can impact the entire area of the bottom surface of each printed circuit board.

9. Apparatus for cleaning printed circuit boards, as claimed in claim 7, including means directing a curtain of air across said inlet opening and said outlet opening to inhibit escape of cleaning liquid from said tank.

10. Apparatus for cleaning printed circuit boards, as claimed in claim 7, including plural successive stages each including one of said tanks and each tank having one of said upper manifolds and one of said lower manifolds mounted therein; the upper run of said endless screen extending through all of said tanks to transport the printed circuit boards successively through each of the stages; the pump in an initial stage supplying a solvent for flux residues to said upper and lower manifolds in said initial stage; the pump in a succeeding stage supplying water to said upper and lower manifolds thereof to wash solvent residue from the printed circuit boards.

11. Apparatus for cleaning printed circuit boards, as claimed in claim 10, including a further stage having the upper run of said endless screen passing therethrough; the pump of said further stage supplying air under pressure to said upper and lower manifolds to remove moisture from the surfaces of the printed circuit boards.

12. Apparatus for cleaning printed circuit boards, as claimed in claim 11, including means following said further stage and directing currents of heated air against the printed circuit boards on the upper run of said endless screen to dry the printed circuit boards.

* * * * *